(12) United States Patent
Cao et al.

(10) Patent No.: US 11,901,244 B2
(45) Date of Patent: Feb. 13, 2024

(54) METHODS OF MAKING A RADIATION DETECTOR

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

(*) Notice: Subject to any disclaimer, the term of this patent is extended or adjusted under 35 U.S.C. 154(b) by 644 days.

(21) Appl. No.: 17/128,952

(22) Filed: Dec. 21, 2020

(65) Prior Publication Data
US 2021/0126041 A1     Apr. 29, 2021

Related U.S. Application Data

(63) Continuation of application No. PCT/CN2018/095526, filed on Jul. 12, 2018.

(51) Int. Cl.
*H01L 21/66* (2006.01)
*H01L 27/146* (2006.01)
*G01T 1/24* (2006.01)

(52) U.S. Cl.
CPC .............. *H01L 22/22* (2013.01); *G01T 1/24* (2013.01); *H01L 27/14659* (2013.01); *H01L 27/14661* (2013.01); *H01L 27/14689* (2013.01); *H01L 27/14696* (2013.01); *H01L 27/14698* (2013.01)

(58) Field of Classification Search
CPC ................................ H01L 22/22; G01T 1/24
See application file for complete search history.

(56) References Cited

U.S. PATENT DOCUMENTS

| | | | | |
|---|---|---|---|---|
| 6,372,554 B1* | 4/2002 | Kawakita | ............... | H10B 12/09 |
| | | | | 257/E21.018 |
| 6,437,341 B1* | 8/2002 | Izumi | ................ | H01L 27/14676 |
| | | | | 250/370.08 |
| 7,117,588 B2 | 10/2006 | Vafi et al. | | |
| 2001/0002727 A1* | 6/2001 | Shiraishi | ............. | H01L 23/5385 |
| | | | | 257/773 |
| 2006/0011852 A1 | 1/2006 | El-Hanany et al. | | |
| 2008/0134793 A1 | 6/2008 | Woychik et al. | | |

(Continued)

FOREIGN PATENT DOCUMENTS

| | | |
|---|---|---|
| CN | 1524189 A | 8/2004 |
| CN | 102243316 A | 11/2011 |

(Continued)

*Primary Examiner* — David P Porta
*Assistant Examiner* — Carolyn Fin
(74) *Attorney, Agent, or Firm* — IPRO, PLLC; Qian Gu

(57) ABSTRACT

Disclosed herein is a method comprising: attaching a plurality of chips to a substrate, wherein each of the chips comprises only one pixel configured to detect radiation. Disclosed herein is a method comprising: attaching a wafer to a substrate, wherein the substrate comprises discrete electrodes, wherein the wafer comprises a radiation absorption layer and a plurality of electrical contacts, wherein each of the electrical contacts is connected to at least one of the discrete electrodes; identifying a defective area of the wafer; replacing a portion of the wafer with a chip configured to absorb radiation, the portion comprising the defective area.

6 Claims, 23 Drawing Sheets

(56) References Cited

U.S. PATENT DOCUMENTS

| | | | |
|---|---|---|---|
| 2010/0193697 A1 | 8/2010 | Bal et al. | |
| 2011/0186742 A1 | 8/2011 | Okada | |
| 2016/0148965 A1 | 5/2016 | Clayton | |
| 2021/0005520 A1* | 1/2021 | Ishio | H01L 21/67271 |

FOREIGN PATENT DOCUMENTS

| | | |
|---|---|---|
| CN | 102829858 A | 12/2012 |
| CN | 106164704 A | 11/2016 |
| CN | 107110981 A | 8/2017 |
| CN | 107710021 A | 2/2018 |

* cited by examiner

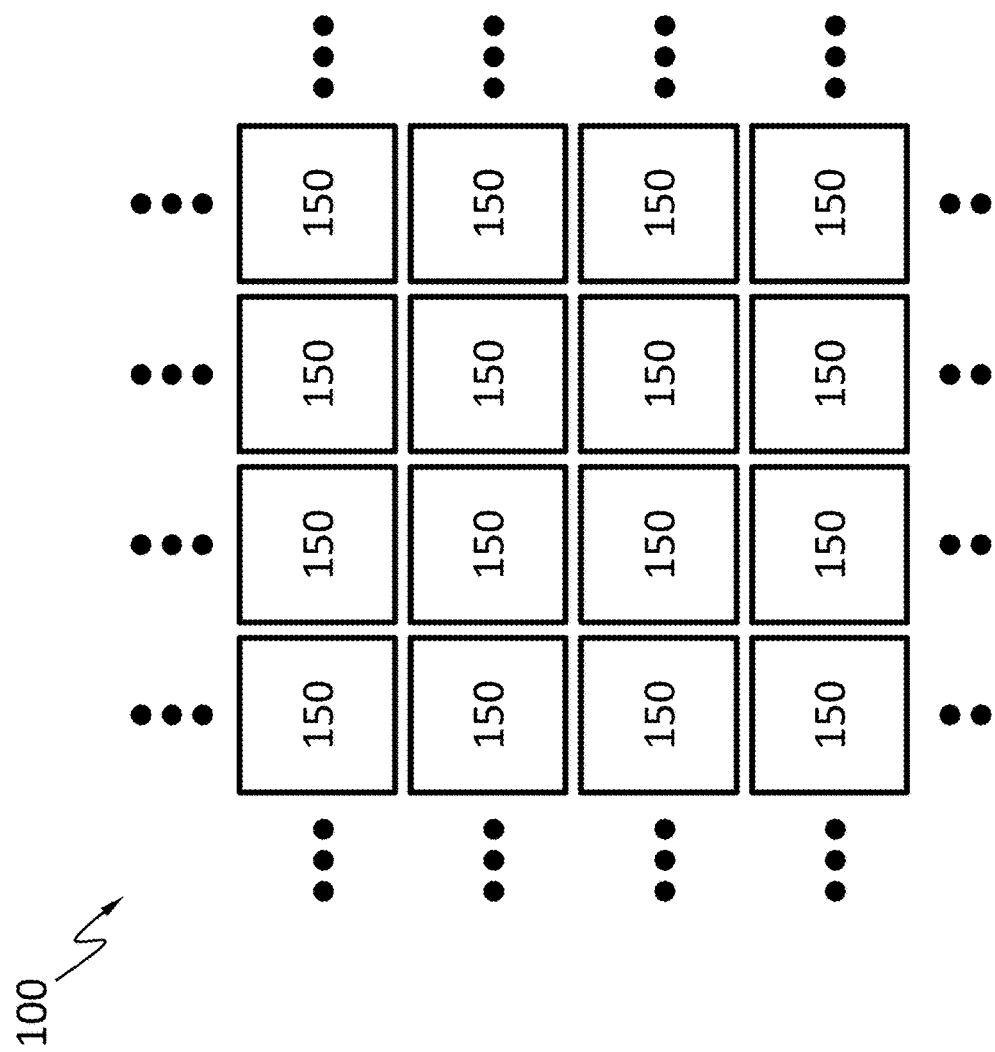

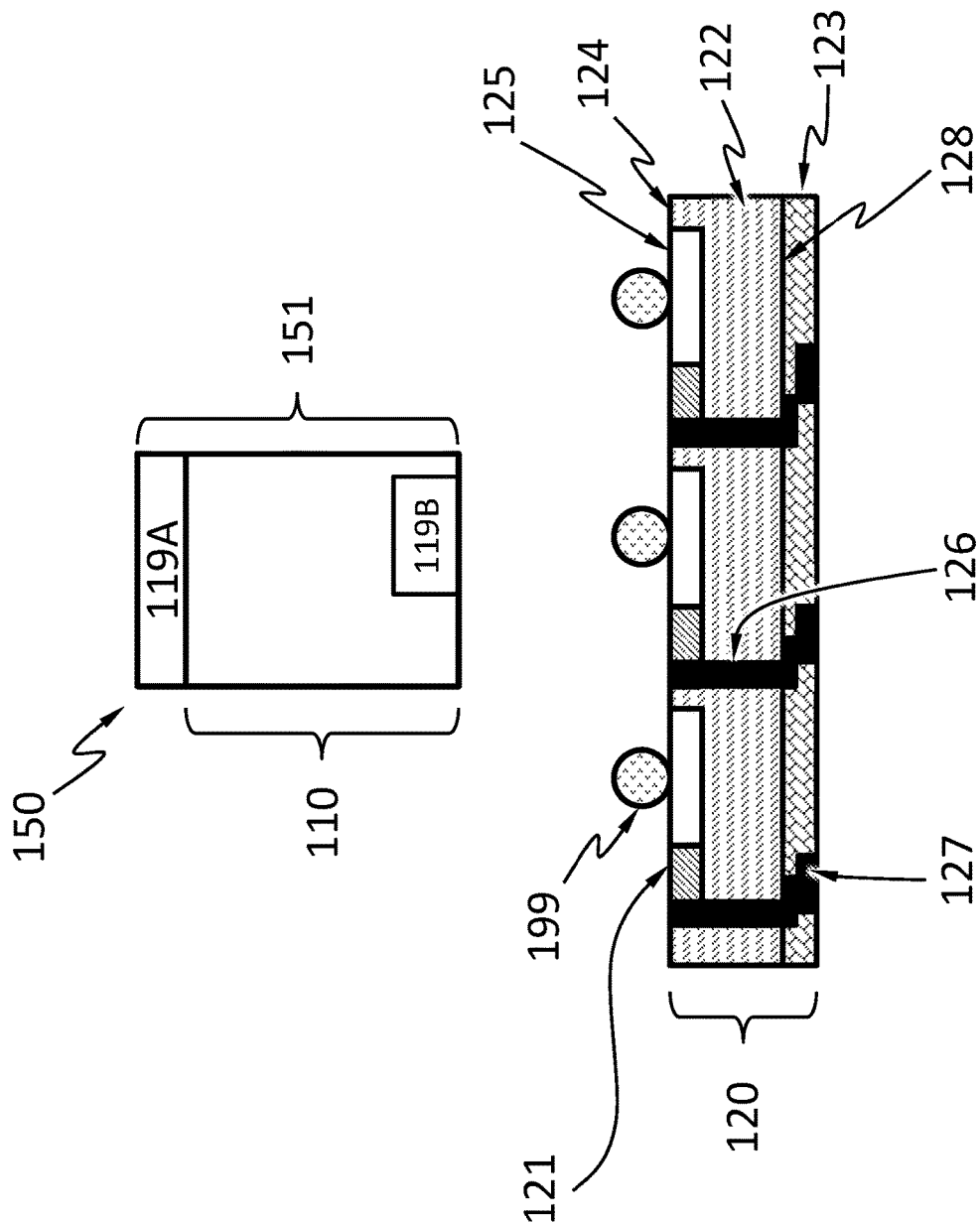

METHODS OF MAKING A RADIATION DETECTOR

TECHNICAL FIELD

The disclosure herein relates to radiation detectors, particularly relates to methods of making radiation detectors.

BACKGROUND

Radiation detectors may be devices used to measure the flux, spatial distribution, spectrum or other properties of radiations.

Radiation detectors may be used for many applications. One important application is imaging. Radiation imaging is a radiography technique and can be used to reveal the internal structure of a non-uniformly composed and opaque object such as the human body.

Early radiation detectors for imaging include photographic plates and photographic films. A photographic plate may be a glass plate with a coating of light-sensitive emulsion. Although photographic plates were replaced by photographic films, they may still be used in special situations due to the superior quality they offer and their extreme stability. A photographic film may be a plastic film (e.g., a strip or sheet) with a coating of light-sensitive emulsion.

In the 1980s, photostimulable phosphor plates (PSP plates) became available. A PSP plate may contain a phosphor material with color centers in its lattice. When the PSP plate is exposed to radiation, electrons excited by radiation are trapped in the color centers until they are stimulated by a laser beam scanning over the plate surface. As the plate is scanned by laser, trapped excited electrons give off light, which is collected by a photomultiplier tube. The collected light is converted into a digital image. In contrast to photographic plates and photographic films, PSP plates can be reused.

Another kind of radiation detectors are radiation image intensifiers. Components of a radiation image intensifier are usually sealed in a vacuum. In contrast to photographic plates, photographic films, and PSP plates, radiation image intensifiers may produce real-time images, i.e., do not require post-exposure processing to produce images. radiation first hits an input phosphor (e.g., cesium iodide) and is converted to visible light. The visible light then hits a photocathode (e.g., a thin metal layer containing cesium and antimony compounds) and causes emission of electrons. The number of emitted electrons is proportional to the intensity of the incident radiation. The emitted electrons are projected, through electron optics, onto an output phosphor and cause the output phosphor to produce a visible-light image.

Scintillators operate somewhat similarly to radiation image intensifiers in that scintillators (e.g., sodium iodide) absorb radiation and emit visible light, which can then be detected by a suitable image sensor for visible light. In scintillators, the visible light spreads and scatters in all directions and thus reduces spatial resolution. Reducing the scintillator thickness helps to improve the spatial resolution but also reduces absorption of radiation. A scintillator thus has to strike a compromise between absorption efficiency and resolution.

Semiconductor radiation detectors largely overcome this problem by direct conversion of radiation into electric signals. A semiconductor radiation detector may include a semiconductor layer that absorbs radiation in wavelengths of interest. When a radiation particle is absorbed in the semiconductor layer, multiple charge carriers (e.g., electrons and holes) are generated and swept under an electric field towards electrical contacts on the semiconductor layer.

SUMMARY

Disclosed herein is a method comprising: attaching a plurality of chips to a substrate, wherein each of the chips comprises only one pixel configured to detect radiation.

According to an embodiment, the method further comprises testing the plurality of chips before attachment to the substrate.

According to an embodiment, the method further comprises filling gaps between the chips with an electrically insulating material.

According to an embodiment, each of the chips comprises a radiation absorption layer.

According to an embodiment, the radiation absorption layer comprises CdZnTe (CZT).

According to an embodiment, the electrically insulating material comprises oxide, nitride, glass, polymer, epoxy or a combination thereof.

According to an embodiment, each of the chips comprises a first electrical contact and a second electrical contact.

According to an embodiment, the substrate comprises discrete electrodes; wherein the second electrical contact of each of the chips is connected to at least one of the discrete electrodes.

According to an embodiment, the method further comprises attaching the chips to an electrically conductive surface of a carrier substrate; wherein the first electrical contact of each of the chips is connected to the electrically conductive surface.

According to an embodiment, the chips are arranged in an array.

According to an embodiment, the method further comprises identifying defective chips among the plurality of chips after attachment to the substrate, and removing the defective chips from the substrate.

Disclosed herein is a method comprising: attaching a wafer to a substrate, wherein the substrate comprises discrete electrodes, wherein the wafer comprises a radiation absorption layer and a plurality of electrical contacts, wherein each of the electrical contacts is connected to at least one of the discrete electrodes; identifying a defective area of the wafer; replacing a portion of the wafer with a chip configured to absorb radiation, the portion comprising the defective area.

According to an embodiment, the radiation absorption layer comprises semiconductor material CdZnTe (CZT).

According to an embodiment, the method further comprises testing a portion of the wafer before attachment to the substrate.

According to an embodiment, the method further comprises testing a portion of the wafer after attachment to the substrate.

According to an embodiment, replacing the portion comprises laser scribing and heating the portion.

According to an embodiment, replacing the portion comprises etching the portion.

BRIEF DESCRIPTION OF FIGURES

FIG. 2 schematically shows that the device may have an array of pixels, according to an embodiment.

FIG. 3 schematically shows a cross-sectional view of a chip comprising one pixel and the electronics layer in a substrate, according to an embodiment.

DETAILED DESCRIPTION

Figure 1A:
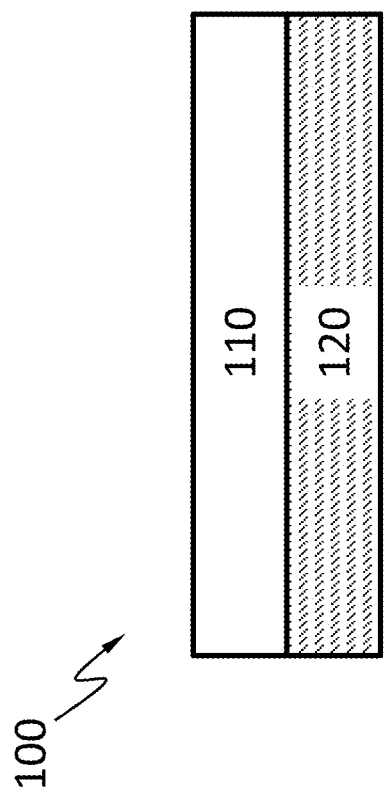
FIG. 1A schematically shows a cross-sectional view of the detector, according to an embodiment.

FIG. 1A schematically shows a cross-sectional view of a radiation detector 100, according to an embodiment. The radiation detector 100 may include a radiation absorption layer 110 and an electronics layer 120 (e.g., an ASIC) for processing or analyzing electrical signals incident radiation generates in the radiation absorption layer 110. In an embodiment, the radiation detector 100 does not comprise a scintillator. The radiation absorption layer 110 may comprise a semiconductor material such as CdZnTe (CZT). The semiconductor may have a high mass attenuation coefficient for the radiation energy of interest.

Figure 1B:
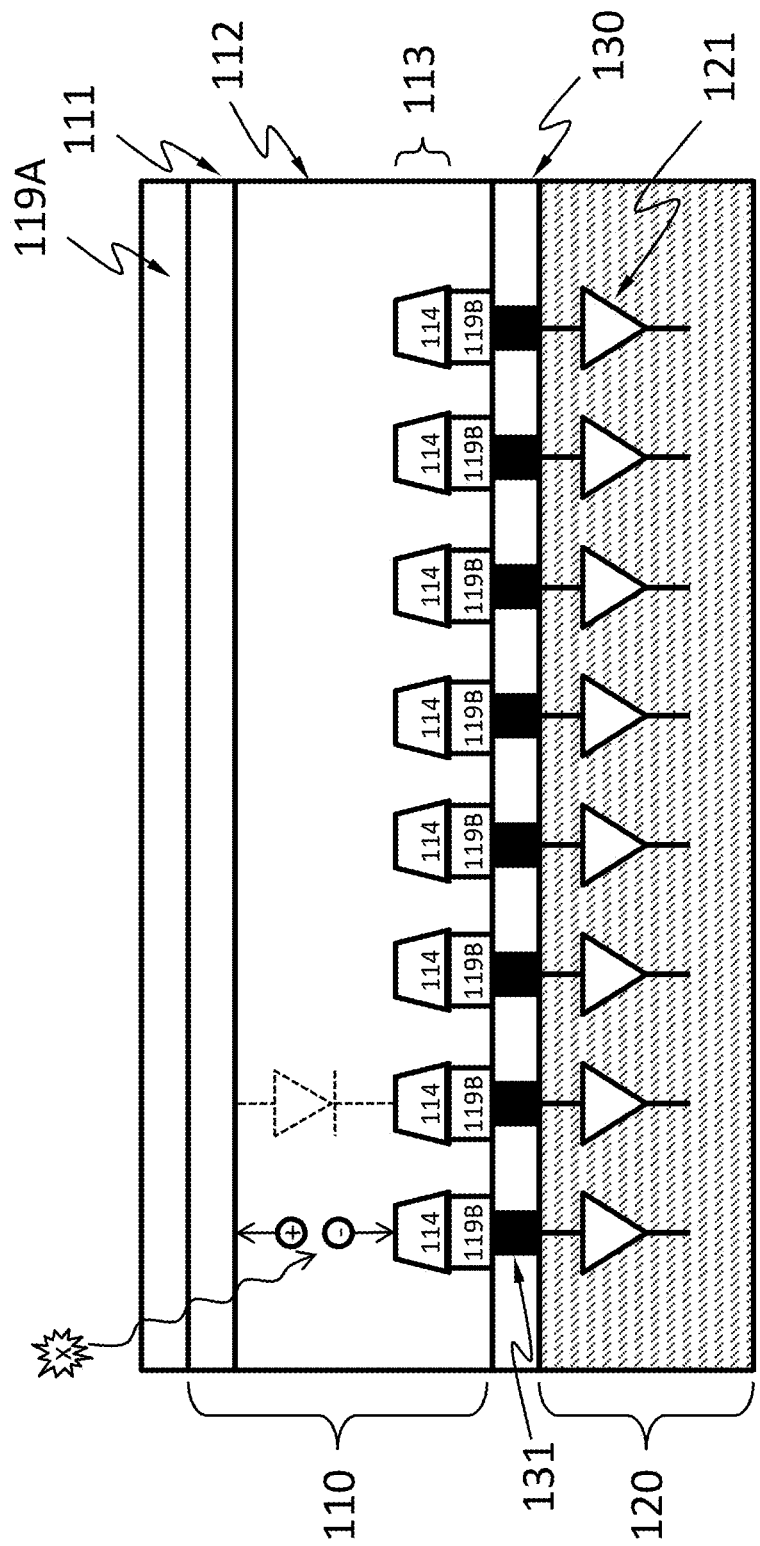
FIG. 1B schematically shows a detailed cross-sectional view of the detector, according to an embodiment.

As shown in a detailed cross-sectional view of the radiation detector 100 in FIG. 1B, according to an embodiment, the radiation absorption layer 110 may include one or more diodes (e.g., p-i-n or p-n) formed by a first doped region 111, one or more discrete regions 114 of a second doped region 113. The second doped region 113 may be separated from the first doped region 111 by an optional intrinsic region 112. The discrete regions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type). In the example in FIG. 1B, each of the discrete regions 114 of the second doped region 113 forms a diode with the first doped region 111 and the optional intrinsic region 112. Namely, in the example in FIG. 1B, the radiation absorption layer 110 comprises at least one diode having the first doped region 111 and a first electrical contact 119A as a shared electrode. The first doped region 111 and the first electrical contact 119A may also have discrete portions.

When a radiation particle hits the radiation absorption layer 110 including diodes, the radiation particle may be absorbed and generate one or more charge carriers by a number of mechanisms. A radiation particle may generate 10 to 100000 charge carriers. The charge carriers may drift to the electrodes of one of the diodes under an electric field. The field may be an external electric field. A second electrical contact 119B may include discrete portions, each of which is in electrical contact with the discrete regions 114. In an embodiment, the charge carriers may drift in directions such that the charge carriers generated by a single radiation particle are not substantially shared by two different discrete regions 114 ("not substantially shared" here means less than 2%, less than 0.5%, less than 0.1%, or less than 0.01% of these charge carriers flow to a different one of the discrete regions 114 than the rest of the charge carriers). Charge carriers generated by a radiation particle incident around the footprint of one of these discrete regions 114 are not substantially shared with another of these discrete regions 114. A pixel 150 associated with a discrete region 114 may be an area around the discrete region 114 in which substantially all (more than 98%, more than 99.5%, more than 99.9%, or more than 99.99% of) charge carriers generated by a radiation particle incident therein flow to the discrete region 114. Namely, less than 2%, less than 1%, less than 0.1%, or less than 0.01% of these charge carriers flow beyond the pixel.

Figure 1C:
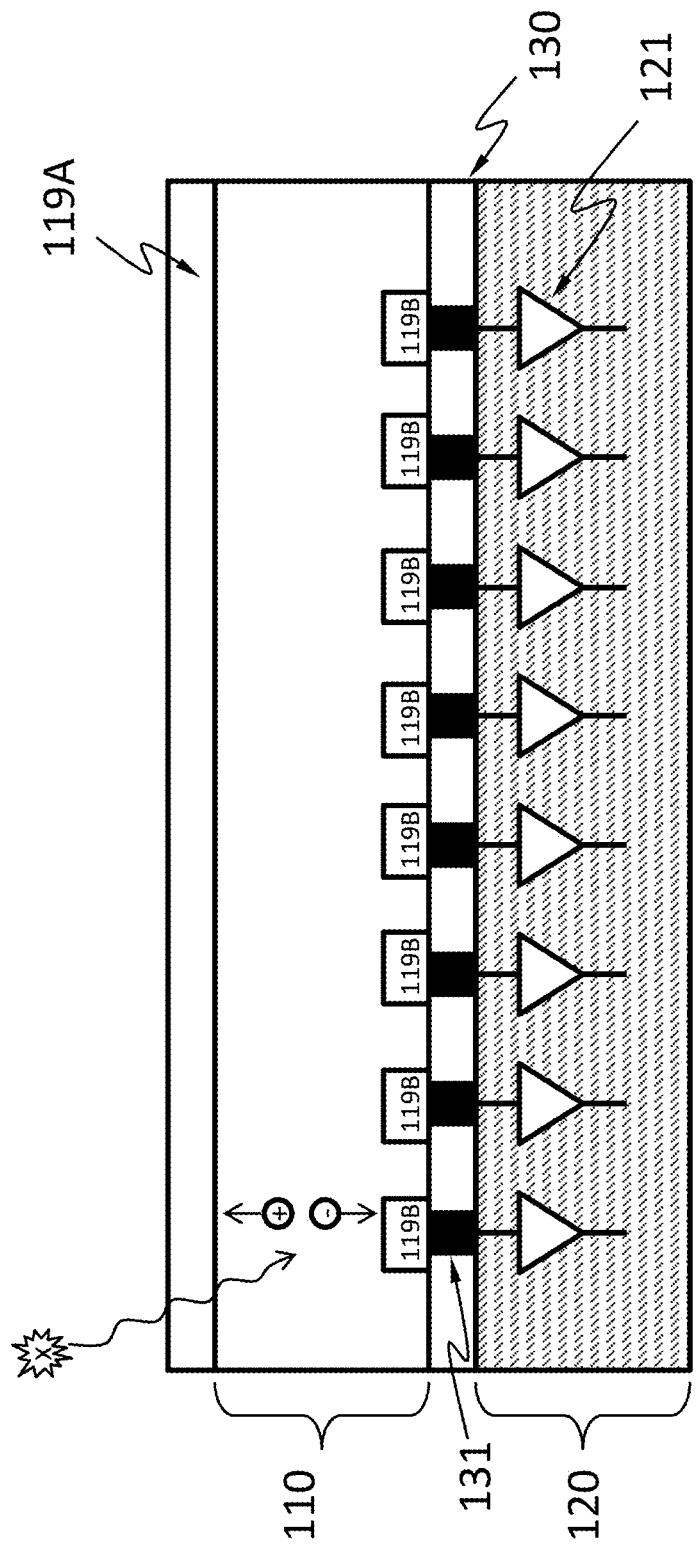
FIG. 1C schematically shows an alternative detailed cross-sectional view of the detector, according to an embodiment.

As shown in an alternative detailed cross-sectional view of the radiation detector 100 in FIG. 1C, according to an embodiment, the radiation absorption layer 110 may comprise a resistor of a semiconductor material such as CdZnTe (CZT), but does not include a diode. The semiconductor may have a high mass attenuation coefficient for the radiation of interest.

When a radiation particle hits the radiation absorption layer 110 including a resistor but not diodes, it may be absorbed and generate one or more charge carriers by a number of mechanisms. A radiation particle may generate 10 to 100000 charge carriers. The charge carriers may drift to the electrical contacts 119A and 119B under an electric field. The field may be an external electric field. The electrical contact 119B includes discrete portions. In an embodiment, the charge carriers may drift in directions such that the charge carriers generated by a single radiation particle are not substantially shared by two different discrete portions of the electrical contact 119B ("not substantially shared" here means less than 2%, less than 0.5%, less than 0.1%, or less than 0.01% of these charge carriers flow to a different one of the discrete portions than the rest of the charge carriers). Charge carriers generated by a radiation particle incident around the footprint of one of these discrete portions of the electrical contact 119B are not substantially shared with another of these discrete portions of the electrical contact 119B. A pixel 150 associated with a discrete portion of the electrical contact 119B may be an area around the discrete portion in which substantially all (more than 98%, more than 99.5%, more than 99.9% or more than 99.99% of) charge carriers generated by a radiation particle incident therein flow to the discrete portion of the electrical contact 119B. Namely, less than 2%, less than 0.5%, less than 0.1%, or less than 0.01% of these charge carriers flow beyond the pixel associated with the one discrete portion of the electrical contact 119B.

The electronics layer 120 may include an electronic system 121 suitable for processing or interpreting signals generated by radiation particles incident on the radiation absorption layer 110. The electronic system 121 may include an analog circuitry such as a filter network, amplifiers, integrators, and comparators, or a digital circuitry such as a microprocessor, and a memory. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the radiation absorption layer 110. Other bonding techniques are possible to connect the electronic system 121 to the pixels without using vias.

FIG. 2 schematically shows that the radiation detector 100 may have an array of pixels 150. The array may be a rectangular array, a honeycomb array, a hexagonal array or any other suitable array. Each pixel 150 may be configured to detect a radiation particle incident thereon, measure the energy of the radiation particle, or both. For example, each pixel 150 may be configured to count numbers of radiation particles incident thereon whose energy falls in a plurality of bins, within a period of time. All the pixels 150 may be configured to count the numbers of radiation particles incident thereon within a plurality of bins of energy within the same period of time. Each pixel 150 may have its own analog-to-digital converter (ADC) configured to digitize an analog signal representing the energy of an incident radiation particle into a digital signal. The ADC may have a resolution of 10 bits or higher. Each pixel 150 may be configured to measure its dark current, such as before or concurrently with each radiation particle incident thereon. Each pixel 150 may be configured to deduct the contribution of the dark current from the energy of the radiation particle incident thereon. The pixels 150 may be configured to operate in parallel. For example, when one pixel 150 measures an incident radiation particle, another pixel 150 may be waiting for a radiation particle to arrive. The pixels 150 may be but do not have to be individually addressable.

FIG. 3 schematically shows that the radiation detector 100 may comprise a plurality of chips 151. Each of the chips 151 may include a single pixel 150 configured to detect the radiation. Each of the chips 151 may include the radiation absorption layer 110, the first electrical contact 119A, and the second electrical contact 119B. The second electrical contact 119B may be used to electrically connect to the electronics layer 120. The electronics layer 120 comprises the substrate 122 having a first surface 124 and a second surface 128. A "surface" as used herein is not necessarily exposed, but can be buried wholly or partially. The electronics layer 120 comprises one or more electrodes 125, which may be on the first surface 124. The second electrical contact 119B of each of the chips 151 may be electrically connected to one or more electrodes 125. The electronic system 121 may be in or on the substrate 122. The electronics layer 120 may comprise one or more vias 126 extending from the first surface 124 to the second surface 128. The electronics layer 120 may comprise a redistribution layer (RDL) 123 on the second surface 128. The RDL 123 may comprise one or more transmission lines 127. The electronic system 121 may be electrically connected to the electrodes 125 and the transmission lines 127 through the vias 126.

The substrate 122 may be a thinned substrate. For example, the substrate may have at thickness of 750 microns or less, 200 microns or less, 100 microns or less, 50 microns or less, 20 microns or less, or 5 microns or less. The substrate 122 may be a silicon substrate or a substrate or other suitable semiconductor or insulator. The substrate 122 may be produced by grinding a thicker substrate to a desired thickness.

The one or more electrodes 125 may be a layer of metal or doped semiconductor. For example, the electrodes 125 may be gold, copper, platinum, palladium, doped silicon, etc.

The vias 126 pass through the substrate 122 and electrically connect electrical components (e.g., the electrodes 125) on the first surface 124 to electrical components (e.g., the RDL) on the second surface 128. The vias 126 are sometimes referred to as "through-silicon vias" although they may be fabricated in substrates of materials other than silicon.

The RDL 123 may comprise one or more transmission lines 127. The transmission lines 127 electrically connect electrical components (e.g., the vias 126) in the substrate 122 to bonding pads at other locations on the substrate 122. The transmission lines 127 may be electrically isolated from the substrate 122 except at certain vias 126 and certain bonding pads. The transmission lines 127 may be a material (e.g., Al) with small mass attenuation coefficient for the radiation energy of interest. The RDL 123 may redistribute electrical connections to more convenient locations.

FIG. 3 further schematically shows bonding between the chip 151 and the electronics layer 120 at the electrical contact 119B and the electrodes 125. The bonding may be by a suitable technique such as direct bonding or flip chip bonding. Direct bonding is a wafer bonding process without any additional intermediate layers (e.g., solder bumps). The bonding process is based on chemical bonds between two surfaces. Direct bonding may be at elevated temperature but not necessarily so. Flip chip bonding uses solder bumps 199 deposited onto contact pads (e.g., the electrical contact 119B of the radiation absorption layer 110 of the chip 151 or the electrodes 125). Either the radiation absorption layer 110 or the electronics layer 120 is flipped over and the electrical contact 119B of the radiation absorption layer 110 are aligned to the electrodes 125. The solder bumps 199 may be melted to solder the electrical contact 119B and the electrodes 125 together. Any void space among the solder bumps 199 may be filled with an insulating material.

FIG. 4A-FIG. 4F schematically show a process of making the radiation detector 100, according to an embodiment.

Figure 4A:
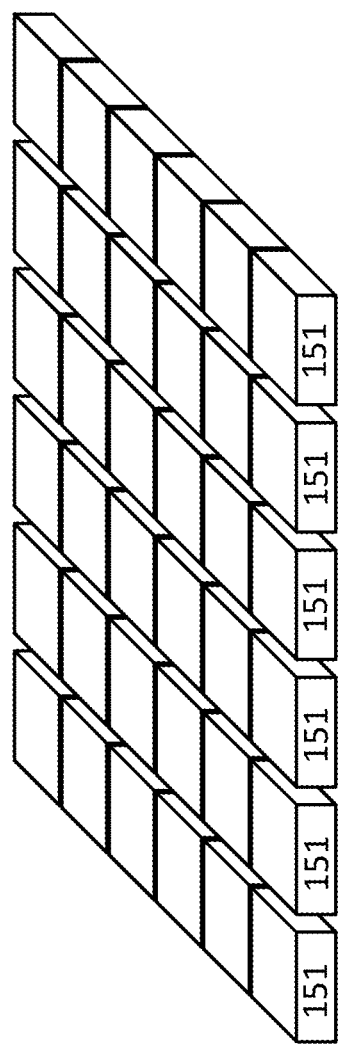
FIG. 4A-FIG. 4F schematically show a process of making the radiation detector, according to an embodiment.

FIG. 4A schematically shows that multiple chips 151 are obtained. Each of the chips comprises the radiation absorption layer 110 and the electrical contacts 119A and 119B. The electrical contacts 119B are not visible in this view. The electrical contacts 119A are omitted from the view. The chips 151 may be obtained by dicing a wafer with multiple dies. Each of the chips 151 may be tested to verify characteristics. For example, each chip may be subject to electrical tests or optical inspections.

Figure 4B:
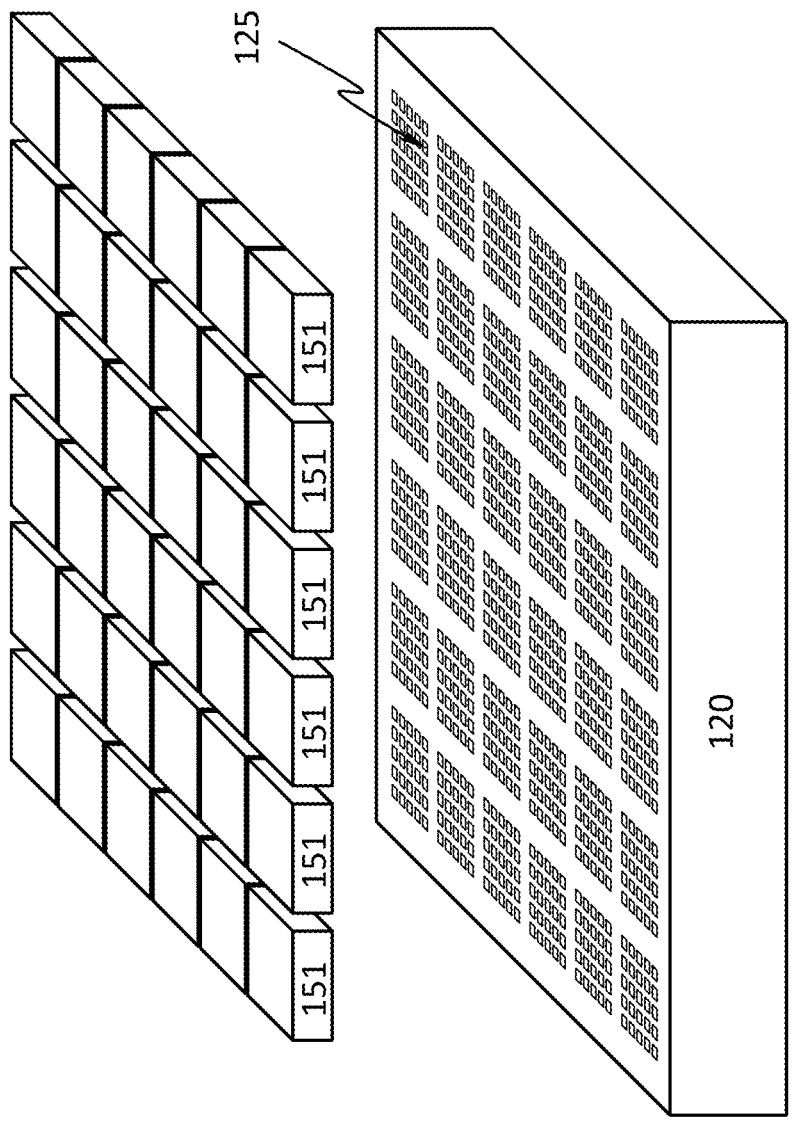

FIG. 4B schematically shows that the electrical contacts 119B of the chips 151 are aligned to the electrodes 125 of the electronics layer 120. In this view, the electrical contacts 119B are not visible because they face the electronics layer 120.

Figure 4C:
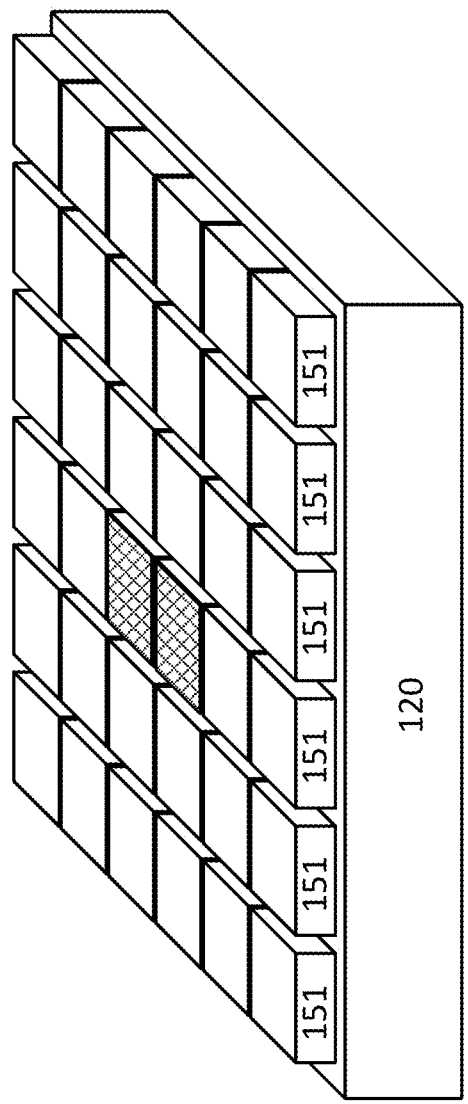
Figure 4D:
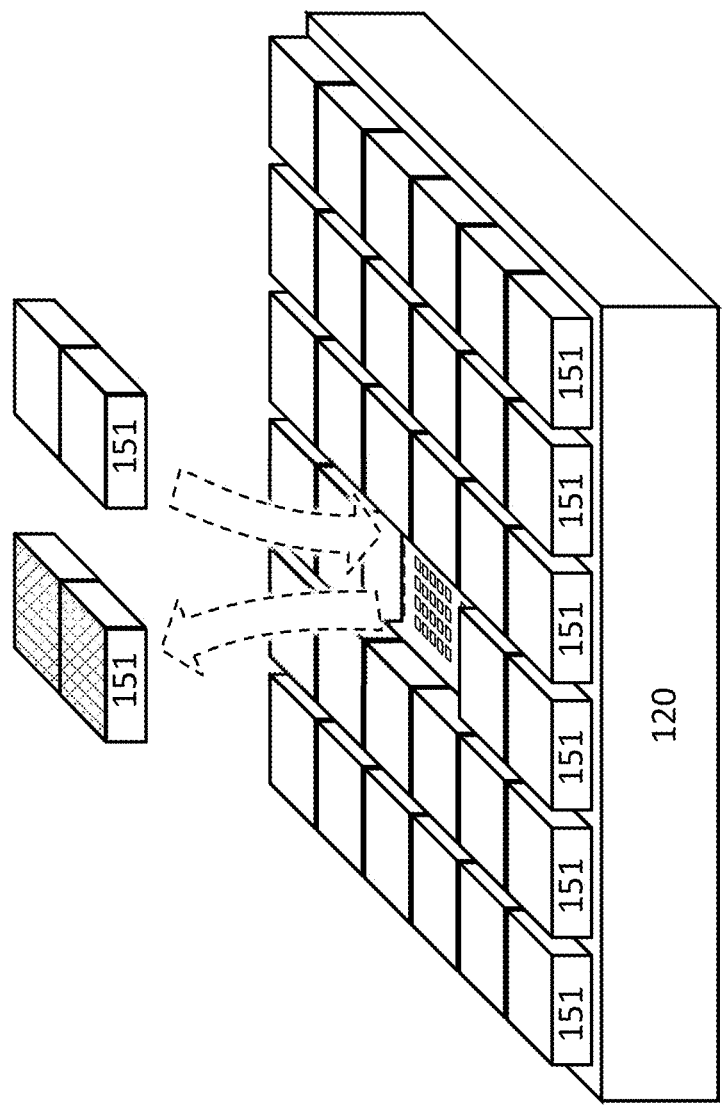

FIG. 4C schematically shows that the chips 151 are bonded to the electronics layer 120 using a suitable bonding method. The electrical contacts 119B are now electrically connected to the electrodes 125. After bonding, the radiation detector 100 may be tested, for example, for electrical characteristics and functionalities. Defective chips (e.g., those crosshatched chips in FIG. 4C) may be identified based on testing results among the chips 151 bonded to the electronics layer 120, and removed from the electronics layer 120. A variety of processes may be used to remove the defective chips. For example, elevated temperature may be applied to the area containing the defective chips to melt the solder bumps 199 in the area. As shown in FIG. 4D, functional chips 151 may be inserted and bonded to the electronics layer 120 to replace the removed defective chips.

Figure 4E:
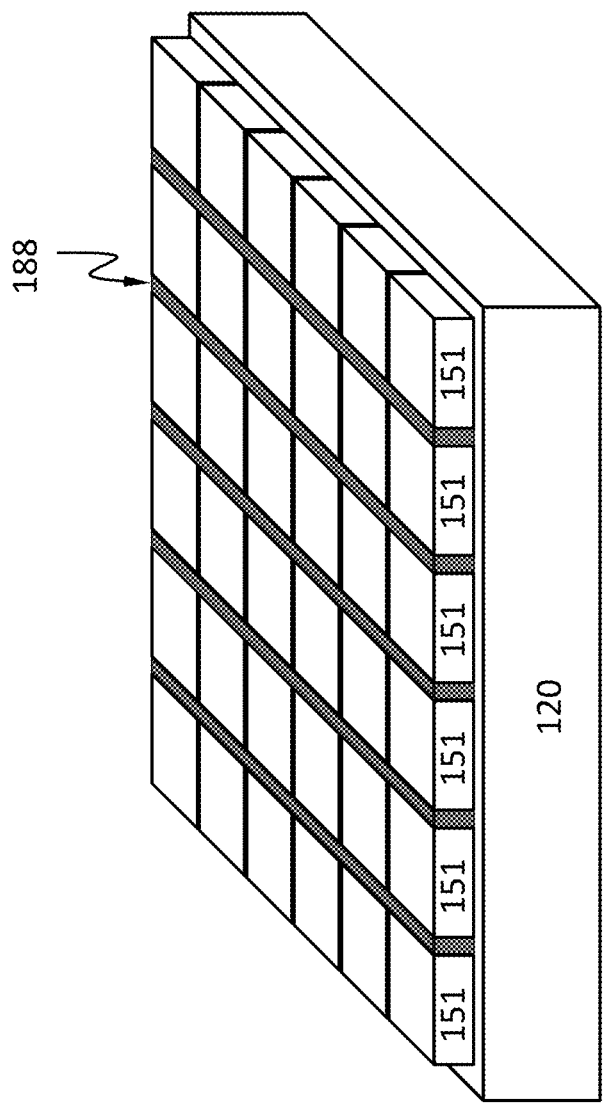

FIG. 4E schematically shows that the gaps between chips 151 are filled with an electrically insulating material 188. Examples of the electrically insulating material 188 may comprise oxide, nitride, glass, polymer, epoxy, or a combination thereof.

Figure 4F:
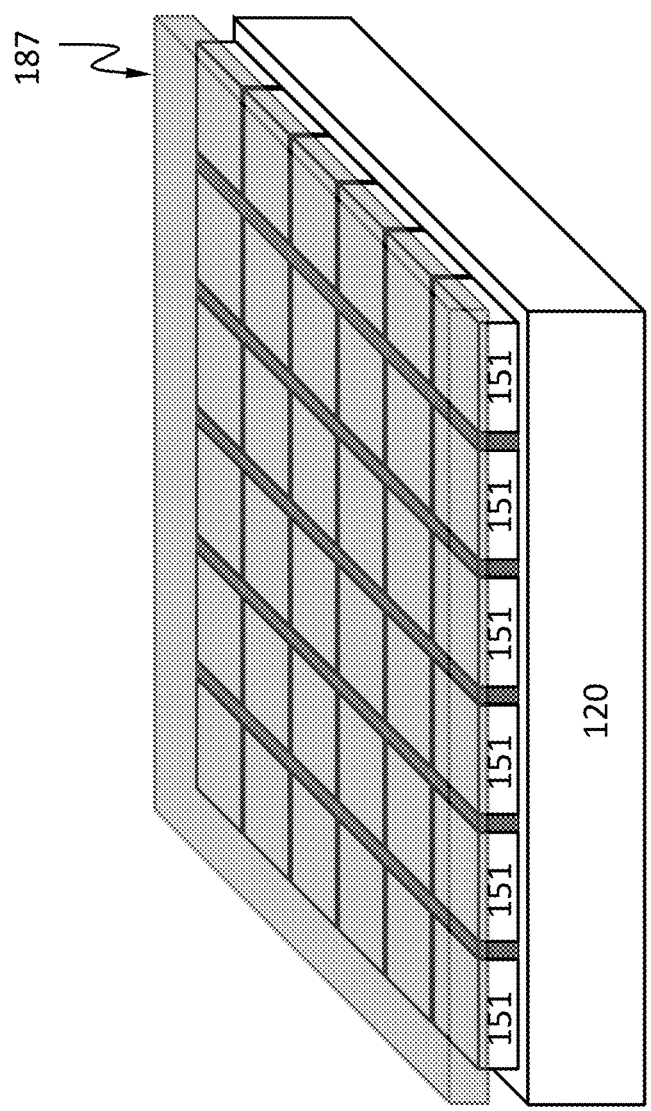

FIG. 4F schematically shows that the electrical contacts 119A of the plurality of chip 151 are electrically connected with an electrically conductive surface of a carrier substrate 187. For example, the electrically conductive surface of the carrier substrate 187 may be a layer of metal deposited over the chips.

Figure 5:
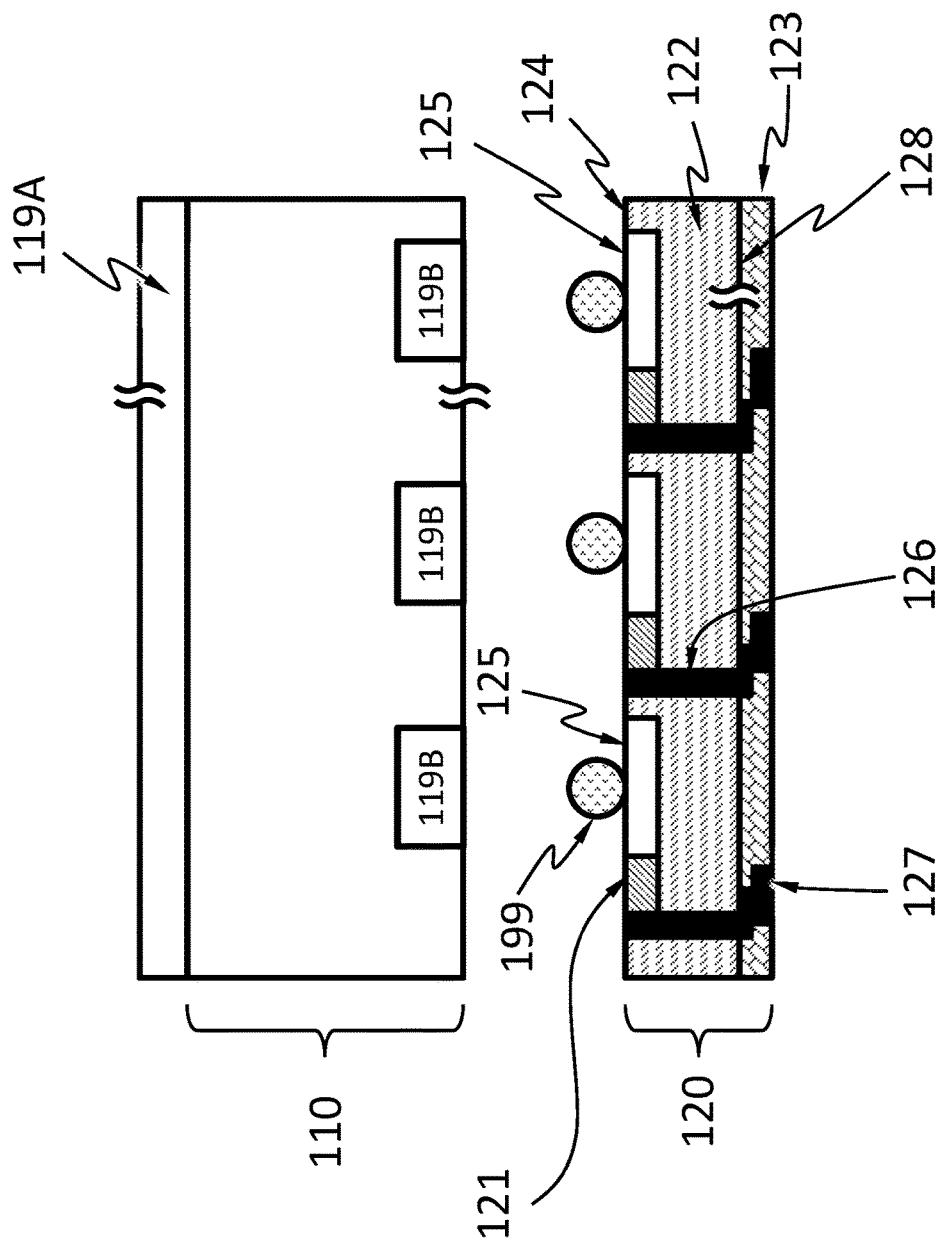
FIG. 5 schematically shows a cross-sectional view of the radiation absorption layer of a wafer and the electronics layer of the substrate, according to an embodiment.

FIG. 5 schematically shows that the radiation detector 100 may comprise a wafer with multiple pixels 150 configured to detect the radiation, according to an embodiment. The wafer may comprise the radiation absorption layer 110, the first electrical contact 119A, and the second electrical contacts 119B. The second electrical contacts 119B may be used to electrically connect to the electronics layer 120. The electronics layer 120 comprises the substrate 122 having the first surface 124 and the second surface 128. The electronics layer 120 comprises one or more electrodes 125, which may be on the first surface 124. The second electrical contacts 119B may be electrically connected to one or more electrodes 125. The electronic system 121 may be in or on the substrate 122. The electronics layer 120 may comprise one or more vias 126 extending from the first surface 124 to the second surface 128. The electronics layer 120 may comprise a redistribution layer (RDL) 123 on the second surface 128. The RDL 123 may comprise one or more transmission lines 127. The electronic system 121 may be electrically connected to the electrodes 125 and the transmission lines 127 through the vias 126.

FIG. 5 further schematically shows bonding between the radiation absorption layer 110 of the wafer and the electronics layer 120 at the electrical contacts 119B and the electrodes 125. The bonding may be by a suitable technique such as direct bonding or flip chip bonding. Direct bonding is a wafer bonding process without any additional intermediate layers (e.g., solder bumps). The bonding process is based on chemical bonds between two surfaces. Direct bonding may be at elevated temperature but not necessarily so. Flip chip bonding uses solder bumps 199 deposited onto contact pads (e.g., the electrical contact 119B of the radiation absorption layer 110 of the chip 151 or the electrodes 125). Any void space among the solder bumps 199 may be filled with an insulating material.

FIG. 6A-FIG. 6D schematically show a process of making the radiation detector 100, according to an embodiment.

Figure 6A:
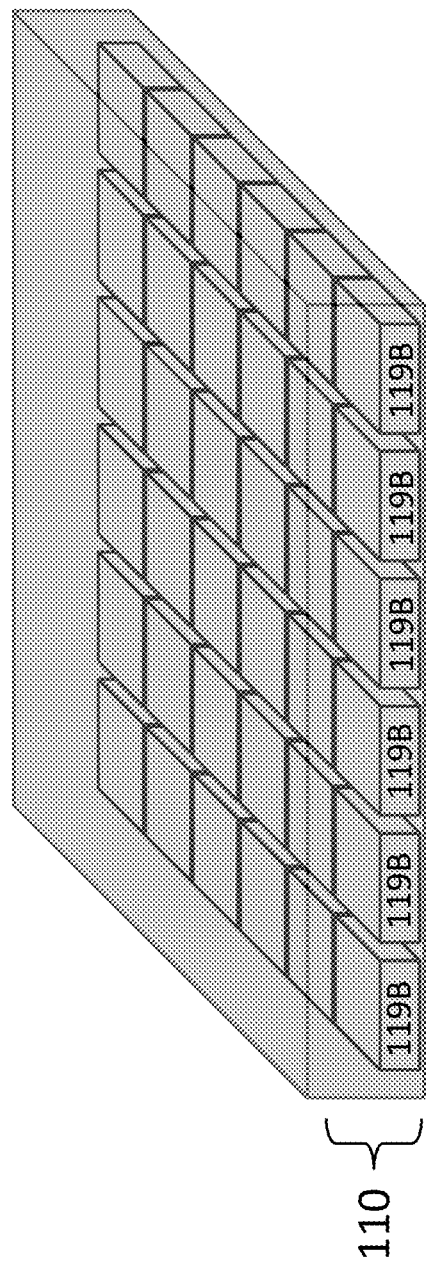
FIG. 6A-FIG. 6D schematically show a process of making the radiation detector, according to an embodiment.

FIG. 6A schematically shows the wafer comprising the radiation absorption layer 110, the plurality of electrical contacts 119A and 119B. The wafer may be tested before it is bonded to the electronics layer 120. For example, each of the pixels in the wafer may be subject to electrical tests and optical inspections. A portion containing a defect may be identified on the wafer based on the test results.

Figure 6B:
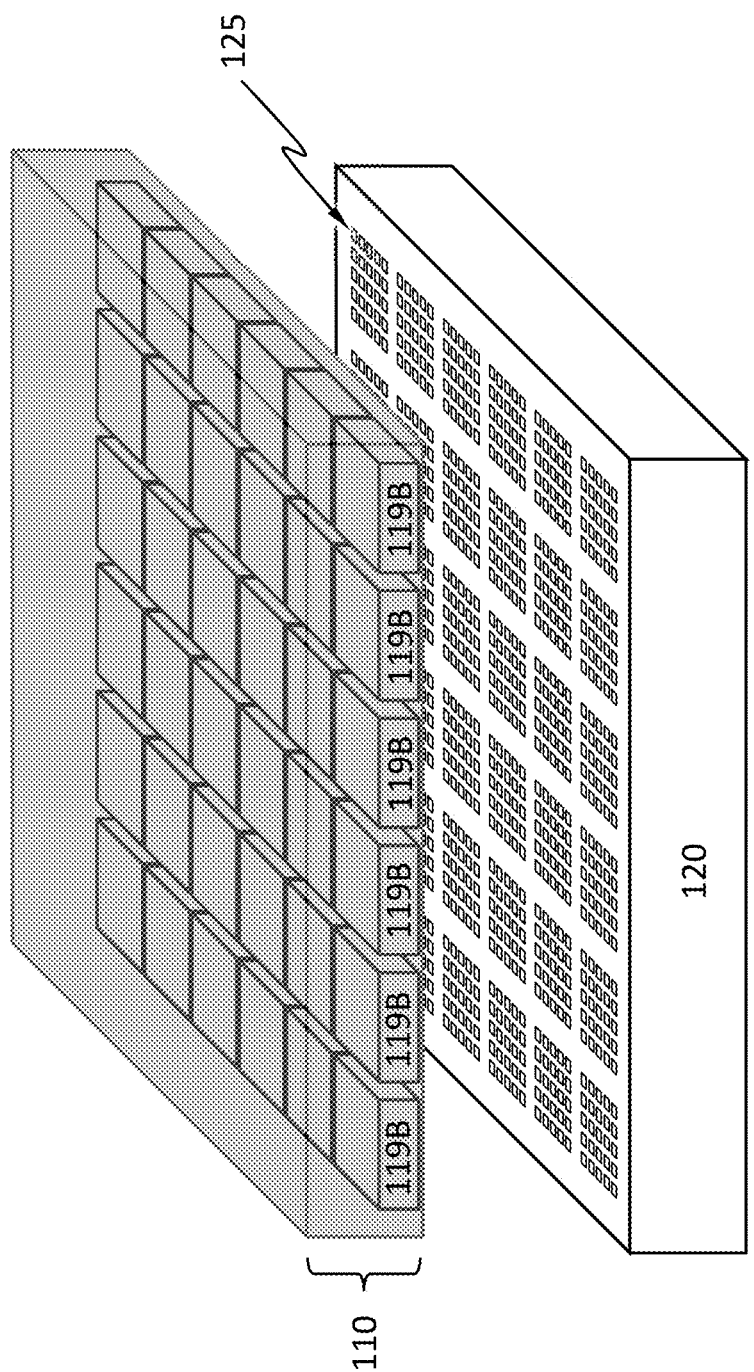

FIG. 6B schematically shows that the electrical contacts 119B are aligned to the electrodes 125 of the electronics layer 120.

Figure 6C:
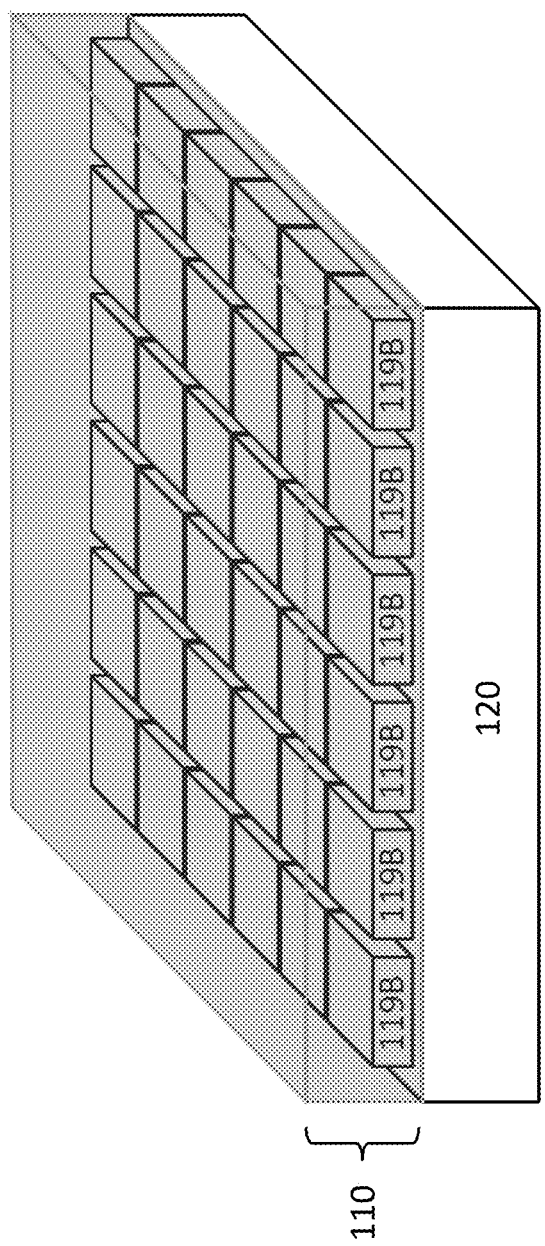

FIG. 6C schematically shows that the radiation absorption layer 110 is bonded to the electronics layer 120 using a suitable bonding method. The electrical contacts 119B are now electrically connected to the electrodes 125. After bonding, the radiation detector may be tested, for example, for electrical characteristics and functionalities. Portions containing at least one defect (e.g., a defective pixel) are identified based on testing results.

Figure 6D:
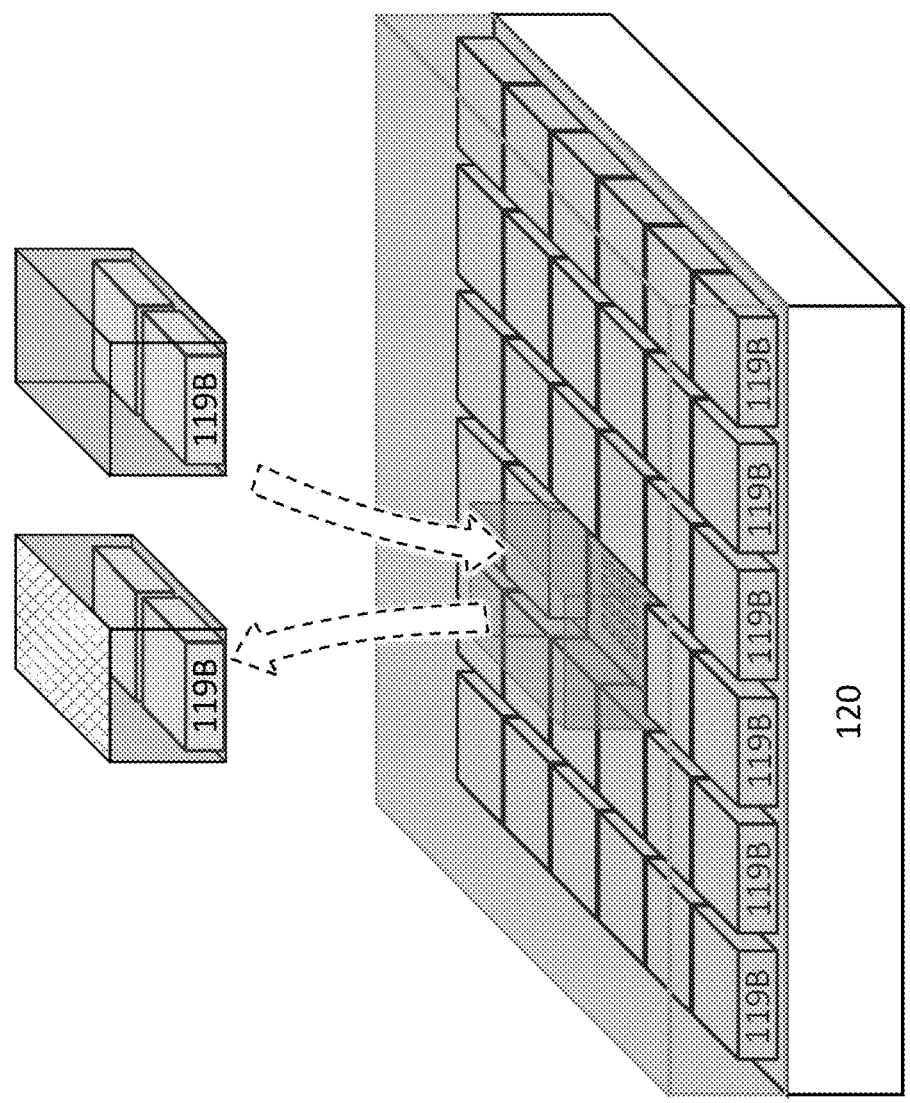

As shown in FIG. 6D, a portion of the wafer containing a defective pixel is removed from the wafer, and the removed portion of wafer is replaced by a chip configured to absorb the radiation, according to an embodiment. Different processes may be used to remove the portion. For example, elevated temperature may be applied to the portion to melt the solder bumps 199 under the portion, and the portion may be separated from the rest of the wafer by laser scribing. For example, the portion may be etched away from the wafer with the rest of the wafer is covered by a protective layer. A functional chip may be inserted and bonded to the electronics layer 120 to replace the removed portion.

Figure 7:
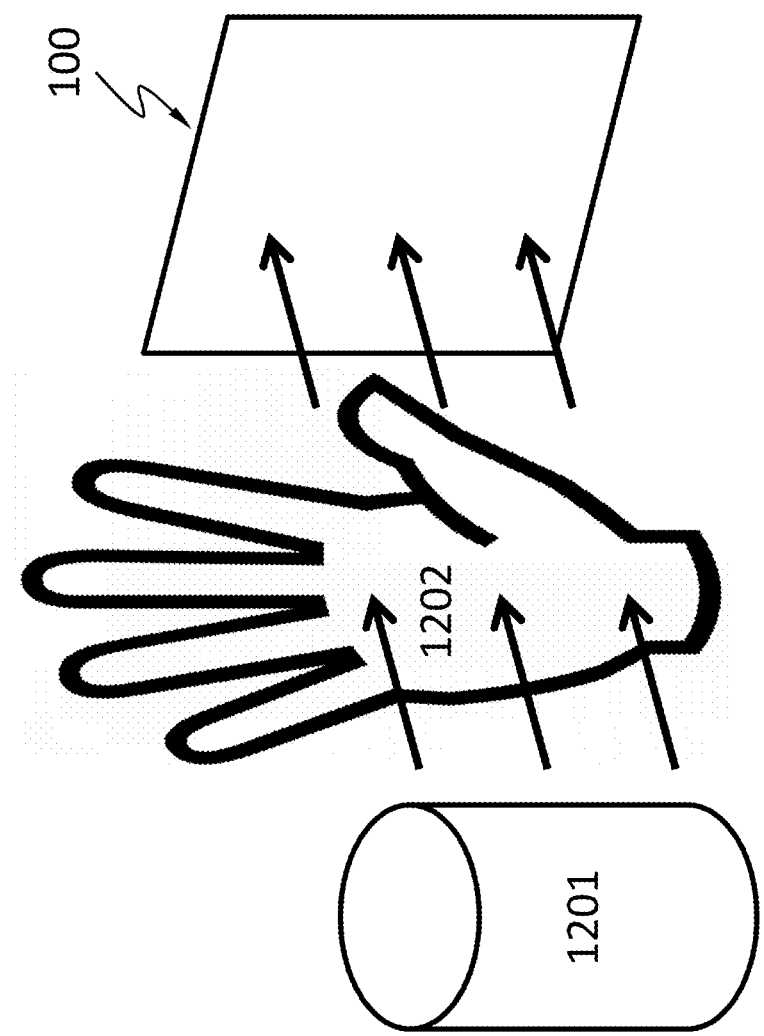
FIG. 7-FIG. 13 each schematically shows a system comprising the radiation detector described herein.

FIG. 7 schematically shows a system comprising the radiation detector 100 described herein. The system may be used for medical imaging such as chest radiation radiography, abdominal radiation radiography, etc. The system comprises a radiation source 1201. Radiation emitted from the radiation source 1201 penetrates an object 1202 (e.g., a human body part such as chest, limb, abdomen), is attenuated by different degrees by the internal structures of the object 1202 (e.g., bones, muscle, fat and organs, etc.), and is projected to the radiation detector 100. The radiation detector 100 forms an image by detecting the intensity distribution of the radiation.

Figure 8:
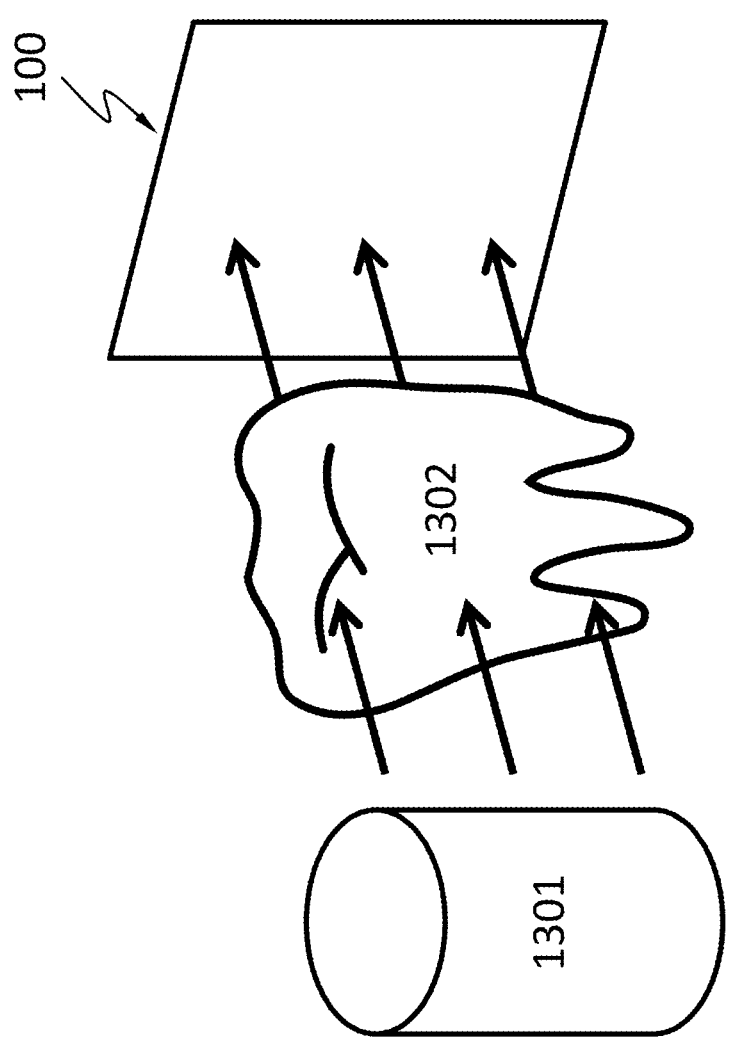

FIG. 8 schematically shows a system comprising the radiation detector 100 described herein. The system may be used for medical imaging such as dental radiation radiography. The system comprises a radiation source 1301. radiation emitted from the radiation source 1301 penetrates an object 1302 that is part of a mammal (e.g., human) mouth. The object 1302 may include a maxilla bone, a palate bone, a tooth, the mandible, or the tongue. The radiation is attenuated by different degrees by the different structures of the object 1302 and is projected to the radiation detector 100. The radiation detector 100 forms an image by detecting the intensity distribution of the radiation. Teeth absorb radiation more than dental caries, infections, periodontal ligament. The dosage of radiation received by a dental patient is typically small (around 0.150 mSv for a full mouth series).

Figure 9:
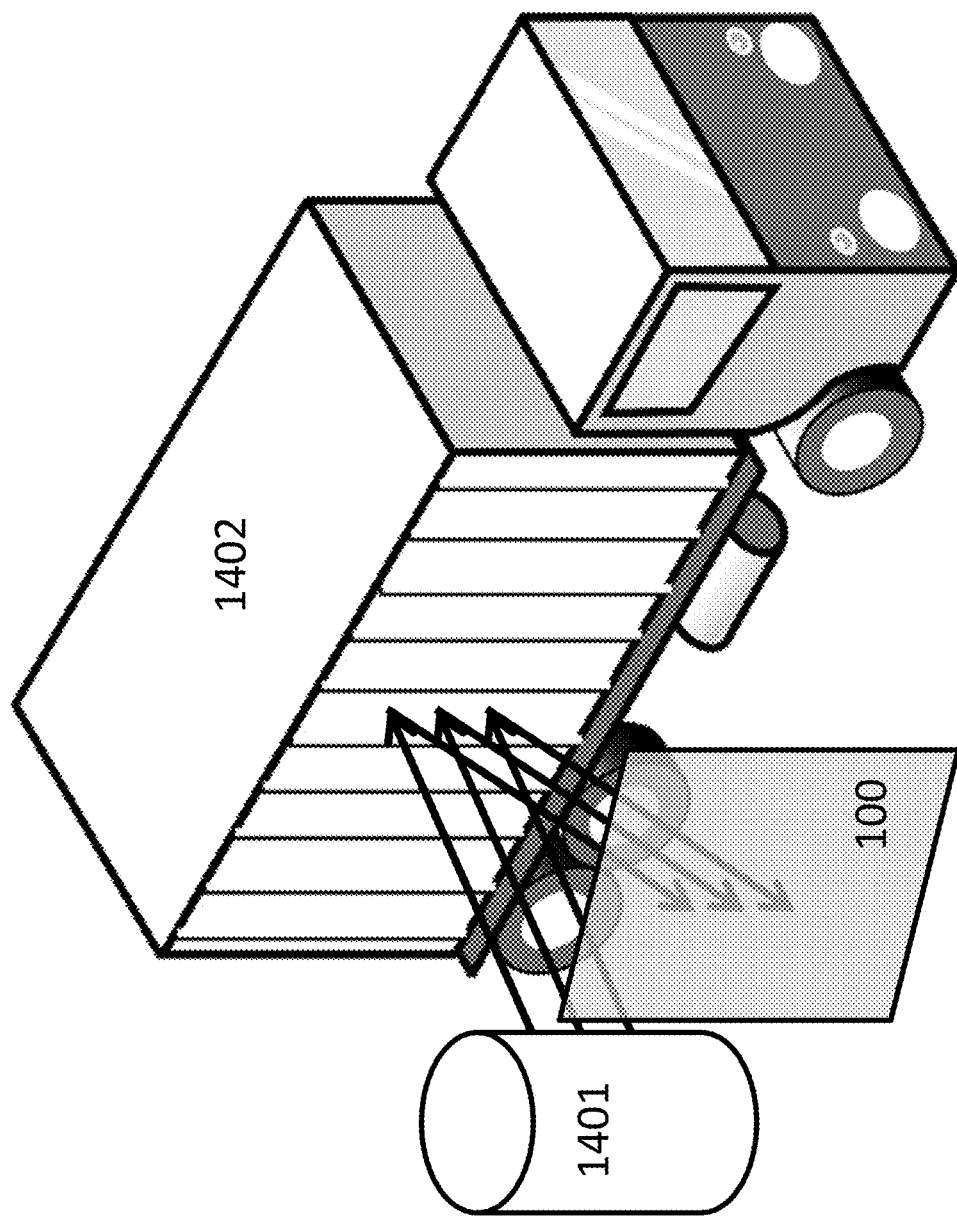

FIG. 9 schematically shows a cargo scanning or non-intrusive inspection (NII) system comprising the radiation detector 100 described herein. The system may be used for inspecting and identifying goods in transportation systems such as shipping containers, vehicles, ships, luggage, etc. The system comprises a radiation source 1401. Radiation emitted from the radiation source 1401 may backscatter from an object 1402 (e.g., shipping containers, vehicles, ships, etc.) and be projected to the radiation detector 100. Different internal structures of the object 1402 may backscatter radiation differently. The radiation detector 100 forms an image by detecting the intensity distribution of the backscattered radiation and/or energies of the backscattered radiation particles.

Figure 10:
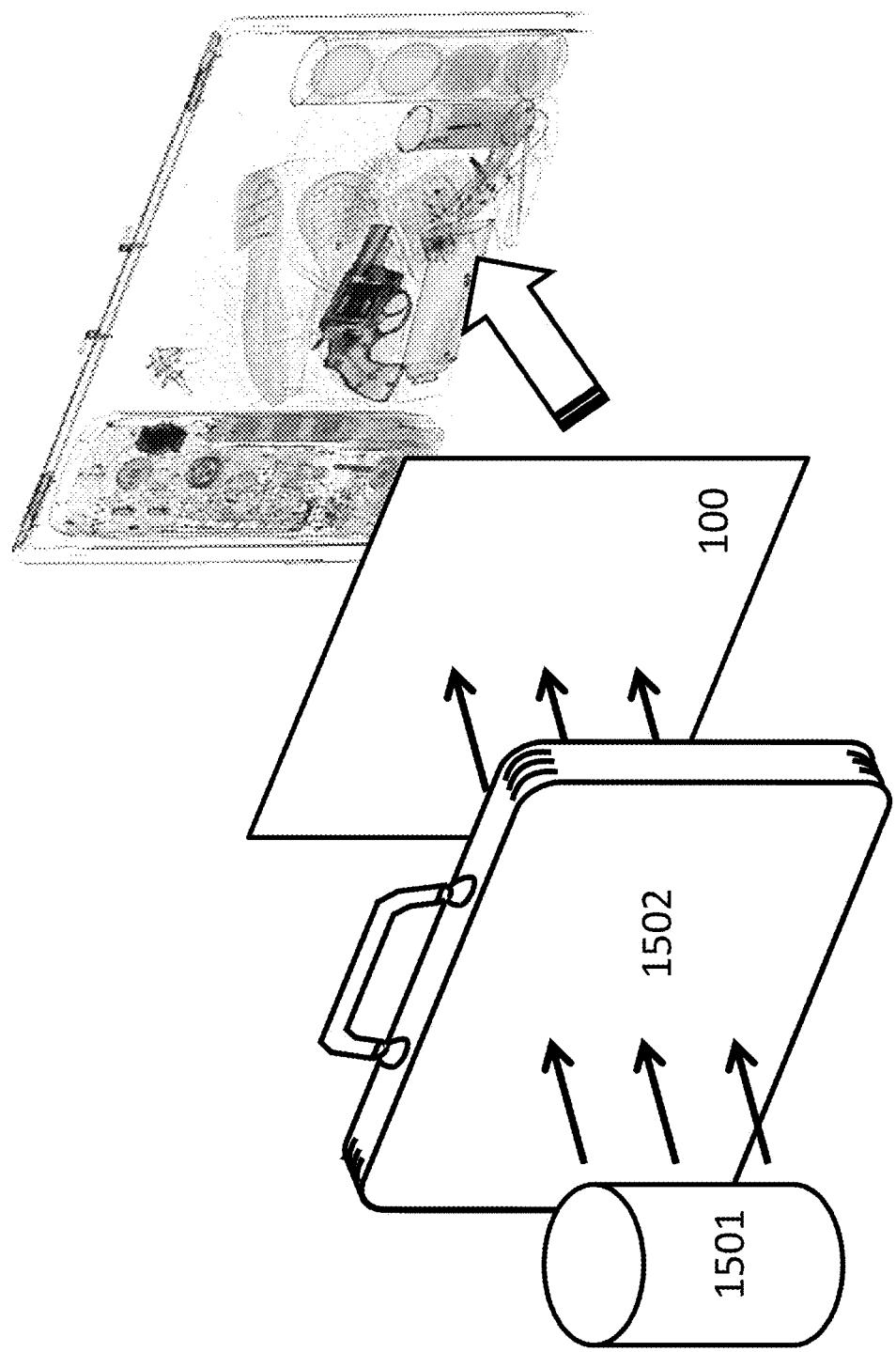

FIG. 10 schematically shows another cargo scanning or non-intrusive inspection (NII) system comprising the radiation detector 100 described herein. The system may be used for luggage screening at public transportation stations and airports. The system comprises a radiation source 1501. Radiation emitted from the radiation source 1501 may penetrate a piece of luggage 1502, be differently attenuated by the contents of the luggage, and projected to the radiation detector 100. The radiation detector 100 forms an image by detecting the intensity distribution of the transmitted radiation. The system may reveal contents of luggage and identify items forbidden on public transportation, such as firearms, narcotics, edged weapons, flammables.

Figure 11:
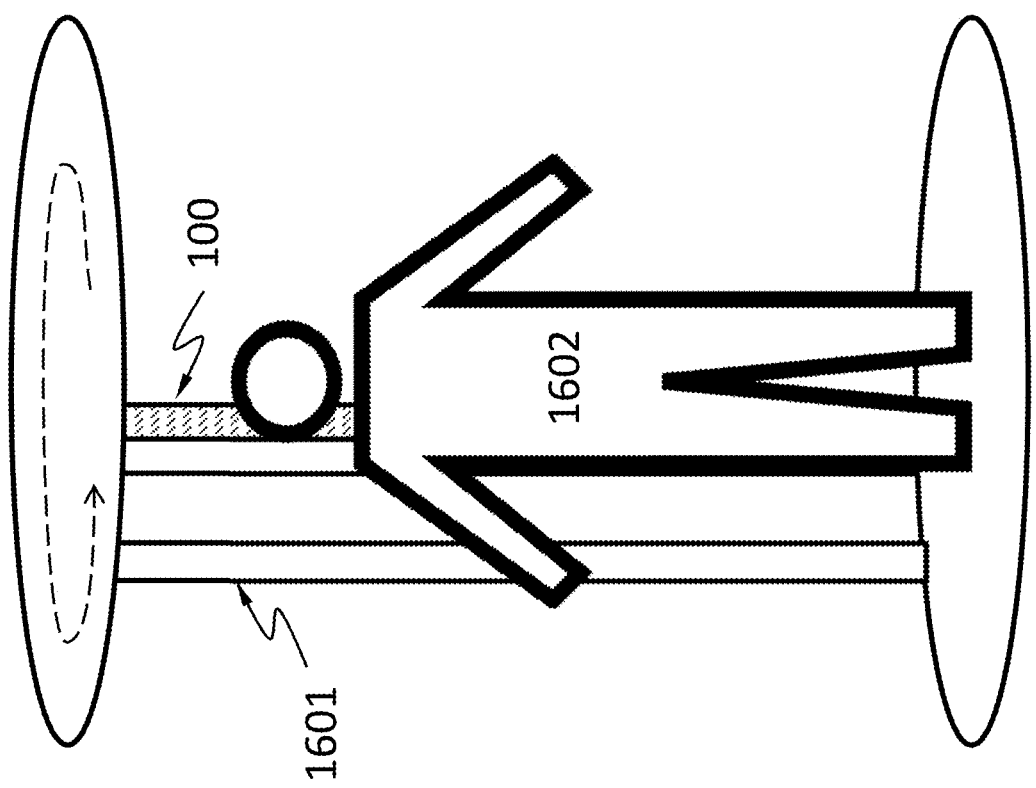

FIG. 11 schematically shows a full-body scanner system comprising the radiation detector 100 described herein. The full-body scanner system may detect objects on a person's body for security screening purposes, without physically removing clothes or making physical contact. The full-body scanner system may be able to detect non-metal objects. The full-body scanner system comprises a radiation source 1601. Radiation emitted from the radiation source 1601 may backscatter from a human 1602 being screened and objects thereon, and be projected to the radiation detector 100. The objects and the human body may backscatter radiation differently. The radiation detector 100 forms an image by detecting the intensity distribution of the backscattered radiation. The radiation detector 100 and the radiation source 1601 may be configured to scan the human in a linear or rotational direction.

Figure 12:
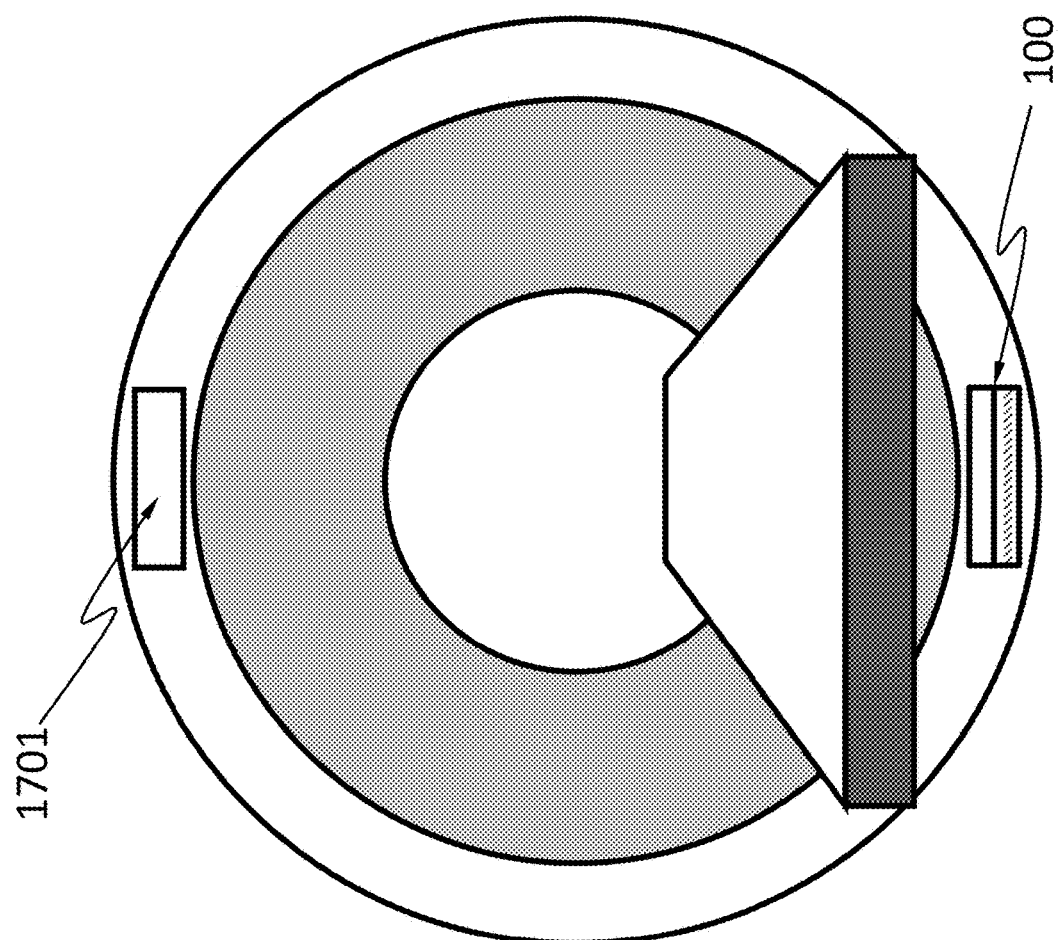

FIG. 12 schematically shows a radiation computed tomography (radiation CT) system. The radiation CT system uses computer-processed radiations to produce tomographic images (virtual "slices") of specific areas of a scanned object. The tomographic images may be used for diagnostic and therapeutic purposes in various medical disciplines, or for flaw detection, failure analysis, metrology, assembly analysis and reverse engineering. The radiation CT system comprises the radiation detector 100 described herein and a radiation source 1701. The radiation detector 100 and the radiation source 1701 may be configured to rotate synchronously along one or more circular or spiral paths.

Figure 13:
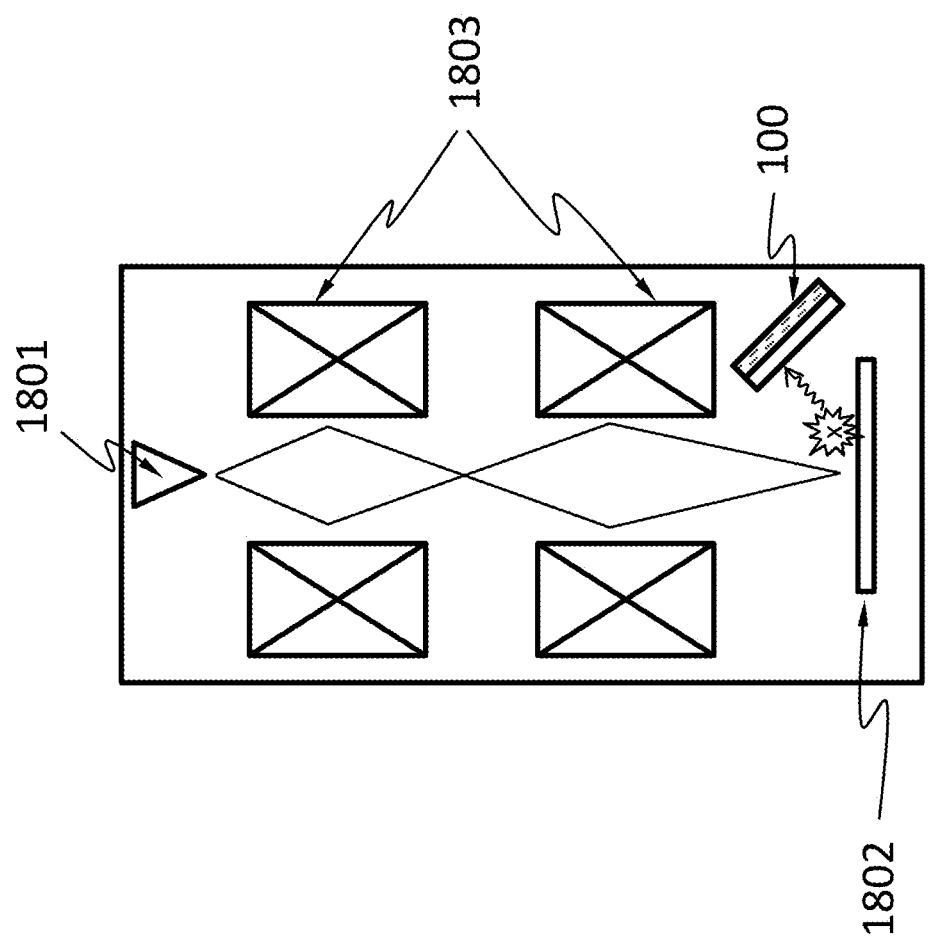

FIG. 13 schematically shows an electron microscope. The electron microscope comprises an electron source 1801 (also called an electron gun) that is configured to emit electrons. The electron source 1801 may have various emission mechanisms such as thermionic, photocathode, cold emission, or plasmas source. The emitted electrons pass through an electronic optical system 1803, which may be configured to shape, accelerate, or focus the electrons. The electrons then reach a sample 1802 and an image detector may form an image therefrom. The electron microscope may comprise the radiation detector 100 described herein, for performing energy-dispersive radiation spectroscopy (EDS). EDS is an analytical technique used for the elemental analysis or chemical characterization of a sample. When the electrons incident on a sample, they cause emission of characteristic radiations from the sample. The incident electrons may excite an electron in an inner shell of an atom in the sample, ejecting it from the shell while creating an electron hole where the electron was. An electron from an outer, higher-energy shell then fills the hole, and the difference in energy between the higher-energy shell and the lower energy shell may be released in the form of a radiation. The number and energy of the radiations emitted from the sample can be measured by the radiation detector 100.

The radiation detector 100 described here may have other applications such as in a radiation telescope, radiation mammography, industrial radiation defect detection, radiation microscopy or microradiography, radiation casting inspection, radiation non-destructive testing, radiation weld inspection, radiation digital subtraction angiography, etc. It may be suitable to use this radiation detector 100 in place of a photographic plate, a photographic film, a PSP plate, a radiation image intensifier, a scintillator, or another semiconductor radiation detector.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method comprising:
attaching a wafer to a substrate, wherein the substrate comprises discrete electrodes, wherein the wafer comprises a radiation absorption layer and a plurality of electrical contacts, wherein each of the electrical contacts is connected to at least one of the discrete electrodes;
identifying a defective area of the wafer;
replacing a portion of the wafer with at least one chip configured to absorb radiation, wherein the portion comprises the defective area.

2. The method of claim 1, wherein the radiation absorption layer comprises semiconductor material CdZnTe (CZT).

3. The method of claim 1, further comprising testing a portion of the wafer before attachment to the substrate.

4. The method of claim 1, further comprising testing a portion of the wafer after attachment to the substrate.

5. The method of claim 1, wherein replacing the portion comprises laser scribing and heating the portion.

6. The method of claim 1, wherein replacing the portion comprises etching the portion.

* * * * *